United States Patent [19]

Dishon

[11] Patent Number: 4,950,623
[45] Date of Patent: Aug. 21, 1990

[54] METHOD OF BUILDING SOLDER BUMPS

[75] Inventor: Giora J. Dishon, Chapel Hill, N.C.

[73] Assignee: Microelectronics Center of North Carolina, Durham, N.C.

[21] Appl. No.: 227,347

[22] Filed: Aug. 2, 1988

[51] Int. Cl.$^5$ ...................... H01L 21/44; H01L 21/48
[52] U.S. Cl. ..................................... 437/183; 29/877; 228/180.2; 437/190; 437/192
[58] Field of Search ............... 437/183, 189, 190, 192, 437/984; 228/180.2, 188; 29/877

[56] References Cited

U.S. PATENT DOCUMENTS

| | | | |
|---|---|---|---|
| 3,663,184 | 5/1972 | Wood et al. | 29/195 |
| 3,839,727 | 1/1974 | Herdzik et al. | 357/71 |
| 4,042,954 | 8/1977 | Harris | 357/71 |
| 4,237,607 | 12/1980 | Ohno | 29/840 |
| 4,273,859 | 6/1981 | Mones et al. | 430/315 |
| 4,293,637 | 10/1981 | Hatada et al. | 430/314 |
| 4,661,375 | 4/1987 | Thomas | 204/15 |

FOREIGN PATENT DOCUMENTS

| | | | |
|---|---|---|---|
| 0085974 | 8/1983 | European Pat. Off. | |
| 55-111127 | 8/1980 | Japan | 437/183 |
| 55-156339 | 12/1980 | Japan | 437/183 |
| 56-49543 | 5/1981 | Japan | |
| 56-66057 | 6/1981 | Japan | 437/183 |
| 57-7147 | 1/1982 | Japan | |
| 57-11141 | 3/1982 | Japan | 437/183 |
| 57-73952 | 5/1982 | Japan | 437/183 |
| 57-197838 | 12/1982 | Japan | |
| 58-219749 | 12/1983 | Japan | 437/183 |
| 59-117135 | 7/1984 | Japan | |
| 59-154041 | 9/1984 | Japan | 437/183 |
| 59-188147 | 10/1984 | Japan | |
| 60-136338 | 7/1985 | Japan | |
| 60-180146 | 9/1985 | Japan | 437/183 |
| 60-180147 | 9/1985 | Japan | |
| 60-198750 | 10/1985 | Japan | 437/183 |
| 61-194744 | 8/1986 | Japan | |
| 63-58945 | 3/1988 | Japan | 437/183 |

OTHER PUBLICATIONS

P. P. Castrucci, R. H. Collins and R. P. Pecoraro; Terminal Metallurgy System for Semiconductor Devices; *IBM Technical Disclosure Bulletin;* vol. 9, No. 12, May, 1967.

T. Kawanobe, K. Miyamoto, Y. Inaba; Solder Bump Fabrication by Electrochemical Method for Flip Clip Interconnection; Musashi Works, Hitachi Ltd., 1450 Josuihon–cho, Kodaira–shi, Tokyo, Japan; pp. 149–155.

English Translation; (19) Japan Patent Office (JP); (11) Laid Open Patent Application; (12) Patent Application Publication (B2); S57–11141; (24) (44) Published Mar. 2, 1982.

English Translation; (19) Japan Patent Office (JP); (11) Laid Open Patent Application; (12) Laid Open Patent Publication (A); S59–154041; (43) Laid Open: Sep. 3, 1984.

English Translation; Japanese Patent 60–180146; *Collective Forming Method of Solder Bumps;* K. Fujiwara, M. Asahi, H. Yoshikiyo and K. Aoki; Applicant: N. Telegrah and K. K. Telephone; Sep. 13, 1985.

*Primary Examiner*—Brian E. Hearn
*Assistant Examiner*—William Bunch
*Attorney, Agent, or Firm*—Bell, Seltzer, Park & Gibson

[57] ABSTRACT

The invention is a method of forming a solder bump on an under bump metallurgy in which a contact pad on a substrate material is partially covered by a passivation layer upon the substrate material which is non-wettable by solder and in which the under bump metallurgy covers the portions of the contact pad which are not covered by the passivation layer and in which the under bump metallurgy overlaps from the contact pad to cover portions of the passivation layer. The method comprises depositing a layer of solder soluble metal upon the under bump metallurgy so as to cover the under bump metallurgy with the solder soluble metal; coating the deposit of solder soluble metal with a layer of solidified solder while substantially avoiding complete dissolution of the solder soluble metal in the solder; and heating the solder until the layer of solder melts and the deposit of solder soluble metals substantially completely dissolves in the melted solder and the surface tension of the melted solder draws the solder and dissolved solder soluble metal away from the non-wettable passivation layer and into a spheroid solder bump.

26 Claims, 1 Drawing Sheet

METHOD OF BUILDING SOLDER BUMPS

FIELD OF THE INVENTION

The present invention relates to a method of forming solder bumps on contact pads and specifically relates to a simplified method of forming solder bumps which may be self-aligned and for which a resulting height may be controllably attained.

BACKGROUND

In the manufacture of microelectronic devices and circuits, there exist a number of applications in which discrete devices that have been manufactured separately from one another must be brought together in electrical contact. For example, integrated circuits (or "chips") often need to be mounted to printed wiring boards, printed circuit boards or any other such devices, most of which can be generally referred to as "chip carriers." The contact between the chip and the chip carrier must have physical, chemical and electrical integrity and stability.

One typical method of forming semiconductor devices has included the fabrication of metal bumps on the top or exposed surface of various substrates. In recent years, greater interest has been observed in such methods. One major type of metal bumps are those formed of solder; i.e., a low melting alloy, usually of the lead-tin type, used for joining metals at temperatures below 700° F. The bumps are brought into contact with a metal structural element often referred to as a "metallurgy"—typically metal pad—that will wet with solder, after which heat is applied to join the solder bump and the metal pad and thereby form the electrical connection.

For example, the metallization layers on semiconductor devices, which are often referred to as "contact pads," are typically formed of aluminum, or in some other applications, copper. Under many circumstances, however, aluminum is sensitive to the subsequent physical, chemical and electrical processes used to fabricate the device after the aluminum has been applied. Aluminum also joins rather poorly with most solders. In order to protect the aluminum during further processing and to facilitate the addition of solder, barrier metals are added to exposed portions of the aluminum. An appropriate barrier metal will be compatible with both the aluminum contact pad and the solder and will form an appropriate transition between them.

In typical applications, solder is first deposited on the contact pad or barrier metals and then remelted. The remelting encourages the liquified solder to retreat from the areas of the substrate which are not wettable by solder, specifically the passivation layer. As the solder retreats, its inherent surface tension draws it into droplets which, because of their generally spheroid shape, extend above the remainder of the semiconductor and form appropriate solder bumps. The techniques of reheating the solder in order to encourage it to form droplets is referred to as a "wet-back" or "reflow" of the solder, and the barrier metal layers under the solder bumps are referred to as the "under bump metallurgy."

When the integrated circuit or other device carrying the bumps is combined with a chip carrier, the solder bumps form contact points which can be joined to appropriate pads often using pressure and heat. A number of processes and resulting structures for solder bumps are currently used. A method used by IBM is the "controlled collapsed chip connection" ("C-4") technique. In this process, a metal mask is aligned on the semiconductor material, a barrier metal alloy which includes gold, copper and chromium is deposited, a second mask is aligned, and then solder is deposited and then reheated to wet back and form droplets. In other processes, such barrier metals are first deposited, then masked with one of the typical photosensitive materials known as photoresists, electroplated with solder, then etched one or more times and then wet back.

There are a number of problems associated with such techniques, however. Some of the processes require rather large capital investment in sophisticated equipment and tools. Other techniques are limited to specific substrates, specific under bump metallurgies, or specific solder systems, or specific combinations thereof. Still other techniques fail to repeatedly produce solder bumps of a consistent defined height, an obvious problem whenever proper physical and electrical contact must be produced and maintained on the scale of an integrated circuit.

Finally, other problems arise as the wafers upon which semiconductor devices are formed become larger and larger. Because of the temperatures at which certain processes take place, and the differences in the coefficients of thermal expansion between wafers of substrate material and the metal masks required to pattern and deposit under bump metallurgies and solders, the masks and wafers can easily become misaligned during these steps, causing unacceptable defects in the resulting device products.

OBJECT OF THE PRESENT INVENTION

Therefore, the object of the present invention is to provide an improved and simplified method of building self-aligned solder bumps having defined heights on either device wafers or chip carriers as well as to provide a process for producing solder bumps which can be adjusted and applied to different solder systems, different substrates, and different under bump metallurgies, while making novel use of existing techniques and equipment.

Accordingly, the invention comprises a method of forming a solder bump on an under bump metallurgy in which a contact pad on a substrate material is surrounded by a passivation layer upon the substrate material, with the under bump metallurgy covering the contact pad. The method comprises depositing a solder soluble metal upon the under bump metallurgy so as to cover the under bump metallurgy with the solder soluble metal. The deposit of solder soluble metal is then coated with a layer of solidified solder while substantially avoiding complete dissolution of the solder soluble metal in the solder. The solder is then heated until the layer of solder melts and the deposit of solder soluble metals substantially completely dissolves in the melted solder and the surface tension of the melted solder draws the solder and the dissolved solder soluble metal into a solder bump covering the under bump metallurgy.

Other objects and advantages of the invention and the manner in which the same are accomplished will be more completely understood with reference to the detailed description and to the drawings in which:

DETAILED DESCRIPTION OF THE PREFERRED EMBODIMENT

Figure 1:
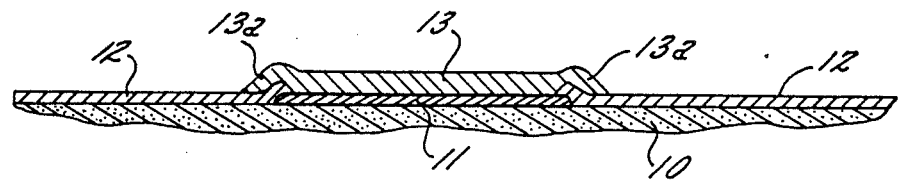
FIG. 1 is a cross sectional view of a substrate carrying a contact pad, a passivation layer and an under bump metallurgy.

FIGS. 1 through 4 illustrate the preferred method of the invention and the various materials and structures which are respectively used and formed. FIG. 1 illustrates a substrate material 10 upon which is positioned a contact pad 11, typically formed of aluminum. The contact pad 11 is in turn partially covered by a passivation layer 12 which is also positioned upon the substrate material 10. In a typical embodiment, the substrate material 10 is silicon, and the passivation layer 12 is silicon dioxide ($SiO_2$).

The invention is not, however, limited to silicon and silicon dioxide, or even to semiconductor substrate materials, but can be appropriately used with any materials that will withstand the soldering temperatures. For example the substrate may include materials such as alumina, gallium arsenide (GaAs), or polymeric printed circuit board (PCB) materials. The passivation material may include any suitable material which is substantially non-wettable by solder, such as silicon nitrides, silicon oxynitrides, polyimides, phosphosilicated glasses (PSG's) and borophosphosilicated glasses (BPSG's). In the preferred embodiment, a small portion 12a of the passivation layer 12 slightly overlaps the edges of the contact pad 11.

The remaining portions of the contact pad 11 are covered by an under bump metallurgy 13 which covers the portions of the contact pad 11 which are not covered by the passivation layer 12. A small portion 13a of the under bump metallurgy 13 further overlaps from the contact pad to in turn cover portions of the passivation layer 12. Typical under bump metallurgies can include chromium, copper, nickel, titanium and other similar metals along with various combinations of these metals which are well known to those familiar with such devices.

For reasons discussed more fully later herein, in a preferred embodiment of the invention, the under bump metallurgy 13 is formed to cover an area of predetermined size over the contact pad 11.

Figure 2:
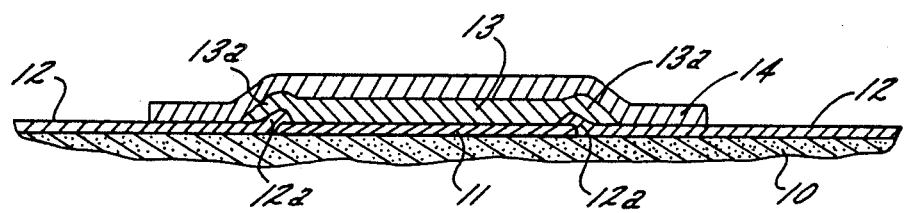
FIG. 2 is a cross sectional view identical to FIG. 1 and also showing a layer of solder soluble metal covering the under bump metallurgy.

FIG. 2 shows the result of the next step in the method, that of depositing a layer of solder soluble metal 14 upon the under bump metallurgy 13 so as to cover the under bump metallurgy with the solder soluble metal 14. Where the solder is of the lead/tin type, the solder soluble metal is preferably a single metal such as platinum, palladium, gold, silver, copper or the like, but can also be alloy of these or other metals as may be desired or convenient. In particular preferred embodiments of the invention, the predetermined size area of the layer of solder soluble metal 14 is larger than the predetermined size area of the under bump metallurgy 13. As FIG. 2 consequently shows, in the resulting structure a portion the passivation layer 12a partially overlaps the contact pad 11, the under bump metallurgy 13 covers the remainder of the contact pad 11, a portion 13a overlaps onto the passivation layer 12, and the layer of solder soluble metal 14 completely covers the under bump metallurgy 13 and in turn overlaps onto the passivation layer 12 as well.

The solder soluble metal layer 14 can be applied using conventional photolithography techniques, including masking and photoresist patterning. One of the advantages of the invention is the straightforward manner in which such techniques can produce a desired pattern of solder soluble metal having a controlled thickness of as little as about 0.5 microns, rather than the 50 microns or more thicknesses required using other techniques. Similarly, these photolithography techniques are already well known from a practical standpoint, so that the invention does not require the large investments in tools and equipment that have been required to use competitive techniques.

Figure 3:
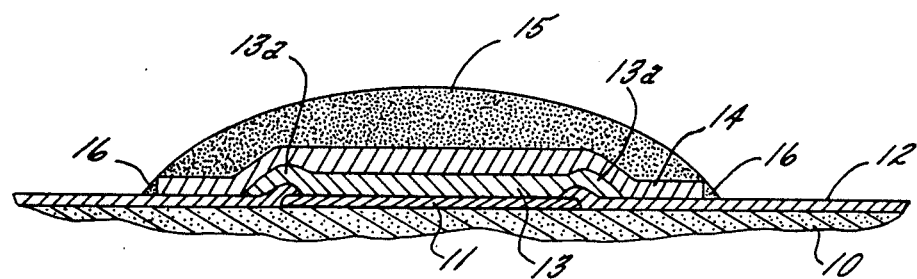
FIG. 3 is a cross sectional view identical to FIG. 1 and FIG. 2 and showing a coating of solder on the layer of solder soluble metals.

FIG. 3 illustrates the results of the next step in the method, in which the deposit of solder soluble metal 14 is in turn coated with a layer of solidified solder 15 while substantially avoiding complete dissolution of the solder soluble metal by the solder.

The description "substantially avoiding complete dissolution" refers to the invention's recognition that when the solder 15 wets the solder soluble metal 14, some of the solder soluble metal will desirably dissolve. Presently, practical control of the method tends to be easiest when only a small amount of the solder soluble metal dissolves during the solder coating step. Conceptually, however, the only limit to the amount of solder soluble metal which needs to remain after the solder coating step is an amount which continues to define the intended predetermined size area. Thus, from a practical standpoint, it is presently beneficial to minimize the amount of solder soluble metal which dissolves in the solder coating step. This preferential minimization, however, does not limit the overall scope of the invention, or the claims herein.

According to the invention, the solder soluble metal 14 is coated with a liquid solder which has a composition that does not wet the surrounding passivation layer 12 so that the area covered by the solder coating 15 is defined by the deposit of solder soluble metal 14 upon the under bump metallurgy 13.

The solder may be applied by wave soldering, solder dipping, or any other appropriate technique. If applied as a liquid, the solder is resolidified upon the layer of solder soluble metal 14. As will be understood by those familiar with these materials and with wetting effects, the respective characteristics of the solder 15 and the passivation layer 12 which make them non-wettable with respect to one another means that the surface tension of the liquid solder will have a greater effect on the deposition of the solder than will the interaction between the solder 15 and the passivation layer 12. In order to minimize potential energy, the surface tension of the liquid solder will tend to draw the solder 15 to a position and shape which covers only the material which it will wet, in this case the solder soluble metal 14. The result is that the solder 15 covers only the solder soluble metal 14, and a small, almost negligible portion 16 of the passivation layer 12 which is defined by the wetting angle of the solder. As known to those familiar with such materials, the wetting angle is in turn defined by the wetability of the passivation layer 12 and the solder soluble metal 14. Where the passivation layer 12 is essentially totally non-wettable and the solder soluble metal totally wettable, the resulting wetting angle will be on the order of 45 degrees.

With respect to portion 16, it should be understood that certain features of the illustrations are set forth for clarity, rather than for accuracy to scale. In particular, the respective overlapping portions of the passivation layer 12a, the under bump metallurgy 13a and the solder 16 are all illustrated in exaggerated fashion and in actuality can be almost negligible in extent.

Therefore, because the area over which the solder 15 will deposit is defined by the layer of solder soluble metal 14, the volume of solder deposited will similarly be determined by the predetermined size area of the layer of the solder soluble metal 14, by the composition of the solder, and by the soldering environment. For example, the viscosity of any given solder composition will vary with temperature, with the result that the surface tension of the liquid solder and the solder droplets which form will correspondingly vary. In other words, by defining the area covered by the layer of solder soluble metal 14, and by selecting the composition of the solder and the soldering conditions, a precise, selected volume of solder can be deposited upon each contact pad area, and as will be seen herein, this results in precise control over the resulting solder bumps.

In order to accomplish the alignment set forth above between the deposit of solder 15, and the solder soluble metal 14, the solder and the solder soluble metal must be selected to compliment one another so that the solder will wet the solder soluble metal within a relatively short period of time, but will not dissolve the solder soluble metal during that period of time. The solder 15 and the solder soluble metal 14 must also be selected, however, so that the solder soluble metal 14 will substantially completely dissolve in the solder 15 when they are heated together for a relatively longer period of time. In other words, the solder soluble metal 14 is coated with liquid solder for a period of time which is sufficient for the solder to wet the solder soluble metal, but insufficient to substantially completely dissolve the solder soluble metal so that the structure illustrated in FIG. 3 can be successfully produced and maintained.

In preferred embodiments, the solder 15 and solder soluble metal 14 are selected with respect to one another so that the wetting action takes place in a period of between about one and ten seconds. Solders typically comprise alloys of lead and tin, although the method of the invention can be used with any suitable soldering system. Other solder alloys of lead and tin can also include gold, or the solders can include alloys of lead and indium.

Perhaps just as importantly, the thickness of the layer of solder soluble metal which is applied can also be selected to control the time period over which the solder coating can be applied without substantially completely dissolving the solder soluble metal, and to similarly control the time period required for the solder soluble metal to substantially completely dissolve in the solder during the heating step. It will be observed by those familiar with such materials and devices, that the structure shown in FIG. 3 is useful in itself, as it represents an aligned, defined volume of solder on a substrate such as an integrated circuit, with the area, volume, and alignment of the solder 15 being defined by the predetermined size area of the layer of the solder soluble metal, the wetting angle formed between the passivation material and the liquid solder, and the composition of the solder.

Figure 4:
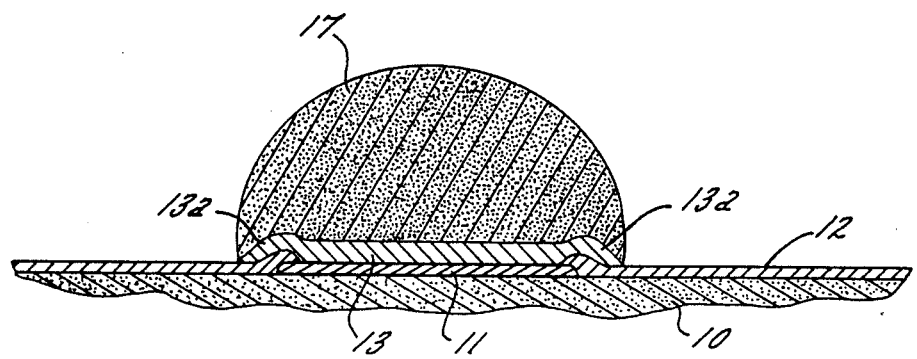
FIG. 4 is a cross sectional view identical to FIGS. 1, 2 and 3 showing the resulting solder bump after the solder has been reheated and the solder has retreated to form a spheroid solder bump upon the under bump metallurgy.

FIG. 4 illustrates the last step in the method and the resulting structure of the solder bump. In this step, the solder 15 is heated until the layer of solder melts and the deposit of solder soluble metal 14 substantially completely dissolves in the melted solder. Because of the non-wetting characteristics of the passivation layer 12 with respect to the solder 15, and because of the surface tension and potential energy considerations set forth earlier, the surface tension of the melted solder 15 draws the solder and dissolved solder soluble metal 14 away from the non-wettable passivation layer 12 and into a spheroid solder bump 17. If, as set forth earlier, the solder 15 was originally deposited as liquid solder and then allowed to solidify, the step illustrated in FIG. 4 is a reheating step.

Once the solder is reheated and forms a bump, the solder may be resolidified in the shape of the bump. In a preferred embodiment, the step of reheating the solidified deposit of solder 15 comprises reheating the solidified deposit 15 for period of time sufficient to completely dissolve the solder soluble metal in the liquid solder. Where the solder 15, the solder soluble metal 14, and the thickness of the solder soluble method have been respectfully selected such that the solder will wet the solder soluble metal in about one to about ten seconds, the solder soluble metal should desirably substantially totally dissolve in the solder in a reheating period of about thirty seconds to one minute. Preferably, the solder soluble metal 14 will completely dissolve in the liquified solder within a short enough time period that the reheating does not adversely affect the physical, chemical or electrical properties of the contact pad, the under bump metallurgy or the contact therebetween.

As set forth earlier, in a preferred embodiment the liquid solder retreats from the larger predetermined size area that was defined by the solder soluble metal 14 to the smaller predetermined size area of the under bump metallurgy 13, so that the solder bump 17 which forms is correspondingly higher that the coating of solder 15 that was on the layer of solder soluble metal 14. Therefore, the resulting height of the solder bump 17 is defined by the predetermined size area of the under bump metallurgy 13 and the volume of solder that was coated on the layer of solder soluble metal 14. In other words, the resulting height of the solder bump is a function of the original size of the under bump metallurgy 13, the original size of the deposit of solder soluble metal 14, and the composition of the solder 15, all of which can be controlled to thereby control and select the defined height of the solder bump 17.

It will be further understood that in a complete sense, the method of the invention can also include the steps of aligning the metal contact pad 11 on the surface of the semiconductor material 10 and then surrounding the contact pad 11 with the layer of surface passivation material 12 which is non-wettable to solder so that the perimeter of the contact pad 11 touches the surface passivation material 12.

Thus, it will be seen that the invention is not limited to one or the other of the structures shown in FIG. 3 and FIG. 4, but in a broad sense covers both. FIG. 3 illustrates the conductive contact pad 11 upon the surface of the semiconductor material 10. A layer of passivating surface material 12 is positioned upon the surface of the semiconductor material 10 and surrounds the contact pad 11. Portions of the passivating surface material 12 overlap portions of the contact pad 11 with the passivating surface material 11 having a composition that is substantially non-wettable by solder. At least one predetermined sized area layer of one or more selected metals or alloys thereof is positioned upon the conductive contact pad 11 and forms an under bump metallurgy 13 upon the conductive contact pad. A predetermined size area layer of a solder soluble metal 14 is positioned upon the under bump metallurgy and carries a coating of solder 15. The solder has a composition which will not wet the passivation surface and substantially covers the predetermined sized area of the solder soluble metal 14. The predetermined size area layer of the solder soluble metal 14 and the composition of the solder coating 15 are correlated to one another to define the volume of solder 15 which coats the solder soluble metal 14 without wetting the passivation material 12. The predetermined size area layer of the under bump metallurgy 13 is also correlated to the predetermined size area of the solder soluble metal 14 in order to define the height of a solder bump which will form upon reheating of the solder and without wetting the passivation surface material 12 based upon the volume of solder in the solder coating 15.

Finally, the invention comprises the bump itself which is a solid solution of a solder and solder soluble metal which is positioned upon under bump metallurgy 13 and has retreated from other portions of the passivation surface layer 12 so as to form a solder bump of a defined height in accordance with the parameters set forth earlier herein.

In the specification and drawings, there have been set forth preferred and exemplary embodiments of the invention and the same are set forth by way of explanation and illustration and by way of limitation, the scope of the invention being set forth in the following claims.

That which is claimed is:

1. A method of forming a solder bump on a solder-wettable under bump metallurgy in which a contact pad on a substrate material is surrounded by a dielectric passivation layer upon the substrate material, and wherein the dielectric passivation layer is non-wettable by solder and in which the solder-wettable under bump metallurgy covers the contact pad, the method comprising:
   (a) depositing a layer of solder soluble metal upon the solder-wettable under bump metallurgy and upon a portion of the surrounding dielectric passivation layer so as to cover the entire solder-wettable under bump metallurgy and a portion of the surrounding dielectric passivation layer with the solder soluble metal;
   (b) coating the deposited layer of solder soluble metal with a layer of solder while substantially avoiding complete dissolution of the solder soluble metal in the solder so that the solder entirely covers the solder soluble metal and those portions of the passivation layer covered by the solder soluble metal; and
   (c) heating the solder until the layer of solder soluble metal substantially completely dissolves in the solder and the surface tension of the solder draws the solder and dissolved solder soluble metal away from the non-wettable passivation layer and into a spheroid solder bump covering the solder-wettable under bump metallurgy and surrounded by the dielectric passivation layer.

2. A method according to claim 1 wherein the step of coating the layer of solder soluble metal comprises coating the layer of solder soluble metal with liquified solder having a composition that does not wet the surrounding passivation layer, so that the area covered by the solder coating is defined by the deposit of solder soluble metal upon the under bump metallurgy.

3. A method according to claim 1 wherein the step of depositing a solder soluble metal upon the under bump metallurgy comprises depositing enough of the solder soluble metal to cover the under bump metallurgy and selected portions of the passivation layer upon the semiconductor materials.

4. A method according to claim 1 wherein the step of coating the layer of solder soluble metal with the solder comprises wave soldering.

5. A method according to claim 1 wherein the step of coating the layer of solder soluble metal with solder comprises solder dipping.

6. A method according to claim 1 wherein the step of depositing a layer of solder soluble metal comprises depositing a layer of solder soluble metal of a predetermined size area upon the layer of under bump metallurgy with the predetermined size area of the layer of solder soluble metal being greater than the area of the under bump metallurgy.

7. A method of forming a solder bump having a defined height on a layer of solder-wettable under bump metallurgy which is positioned upon a contact pad which is in turn positioned upon a layer of substrate material and wherein the contact pad is surrounded and bordered by a dielectric passivation surface layer upon the substrate material, and wherein the passivation surface layer is non-wettable by solder; the method comprising:
   (a) forming a layer of solder soluble metal of a predetermined size area upon the layer of solder-wettable under bump metallurgy and upon a portion of the surrounding passivation layer with the predetermined size area of the layer of solder soluble metal being greater than the area of the under bump metallurgy;
   (b) coating the layer of solder soluble metal with a deposit of liquid solder while substantially avoiding complete dissolution of the solder soluble metal by the solder so that the solder entirely covers the solder soluble metal and those portions of the passivation layer covered by the solder soluble metal, and with the solder having a composition which does not wet the passivation layer so that the area coated with solder is defined by the predetermined size area of the layer of solder soluble metal and where the volume of coated solder is determined by the soldering conditions;
   (c) solidifying the deposit of liquid solder;
   (d) reheating the solidified deposit of solder to a liquid state and until the layer of solder soluble metal substantially completely dissolves in the liquid solder and the liquid solder forms a droplet of solder which substantially covers only the layer of solder-wettable under bump metallurgy and which has retreated from the non-wettable passivation surface layer, so that the height of the resulting solder bump is defined by the volume of solder deposited and the predetermined size area of the under bump metallurgy; and (e) solidifying the resulting solder bump.

8. A method according to claim 7 wherein the step of coating the layer of under bump metallurgy with a layer of solder soluble metal comprises coating the layer of under bump metallurgy with a predetermined size area of solder soluble metal which overlaps onto the passivation layer.

9. A method according to claim 7 wherein the step of coating the solder soluble metal with liquid solder comprises coating the solder soluble metal with liquid solder for a period of time which is sufficient for the solder to wet the solder soluble metal, but insufficient to substantially completely dissolve the solder soluble metal.

10. A method according to claim 9 wherein the solder soluble metal is covered with liquid solder for a period of between about one and about ten seconds.

11. A method according to claim 7 wherein the step of reheating the solidified deposit of solder comprises reheating the solidified deposit for a period of time sufficient to completely dissolve the solder soluble metal in the liquid solder.

12. A method according to claim 11 comprising reheating the solidified deposit of solder for a period of between about thirty seconds to one minute.

13. A method according to claim 7 wherein the solder soluble metal is selected from the group consisting of: platinum, palladium, gold, silver, and copper.

14. A method according to claim 2 wherein the dielectric passivation layer is selected from the group consisting of silicon dioxide, silicon nitride, silicon oxynitride, polymeric materials, phosphosilicate glasses, and borophosphosilicate glasses.

15. A method according to claim 7 wherein the solder is an alloy of lead and tin.

16. A method according to claim 15 wherein the alloy further comprises gold.

17. A method according to claim 7 wherein the solder is an alloy of lead and indium.

18. A method according to claim 7 wherein the contact pad is selected from the group consisting of aluminum and copper.

19. A method according to claim 7 wherein the substrate material comprises silicon.

20. A method according to claim 7 wherein the under bump metallurgy comprises at least one metal selected from the group consisting of chromium, copper, nickel, and titanium, and alloys thereof.

21. A method of forming a self-aligned solder bump having a predetermined selected height on a substrate, the method comprising:

(a) forming a layer of solder-wettable under bump metallurgy having a predetermined size area on a contact pad and wherein the contact pad is upon a semiconductor material and is surrounded on the semiconductor material by a layer of dielectric surface passivation material upon the semiconductor material, and wherein the dielectric passivation material is non-wettable by solder;

(b) covering the layer of solder-wettable under bump metallurgy and a portion of the surrounding passivation layer with a layer of a solder soluble metal having a predetermined size area which is larger than the predetermined size area of the layer of under bump metallurgy;

(c) coating the layer of solder soluble metal with liquified solder for a time sufficient to substantially wet the solder soluble metal with solder, but insufficient to substantially completely dissolve the solder soluble metal to dissolve in the liquid solder, such that the volume of solder deposited upon the layer of solder soluble metal is defined by the predetermined sixe area of the layer of solder soluble metal and a wetting angle formed between the dielectric passivation material and the liquid solder;

(d) solidifying the solder;

(e) reheating the solder to liquid solder for a time sufficient for the solder soluble metal to substantially completely dissolve in the liquid solder so that the liquid solder retreats from the larger predetermined size area that was defined by the solder soluble metal to the smaller predetermined size area of the solder-wettable under bump metallurgy, and thereby forms a solder bump which is correspondingly higher than the coating of solder that was on the layer of solder soluble metal, and for which the height is defined by the predetermined size area of the under bump metallurgy and the volume of solder that was coated upon the layer of solder soluble metal; and (f) solidifying the defined solder bump.

22. A method according the claim 3 wherein the solder soluble metal and the composition of the solder are selected so that upon initial contact with one another the liquified solder will wet the solder soluble metal but will not substantially completely dissolve the solder soluble metal so that the liquified solder can be solidified upon the layer of solder soluble metal, and further so that upon reheating of the solder to a liquid state the solder soluble metal will substantially completely dissolve in the liquified solder within a short enough time period that the reheating does not adversely affect the physical, chemical or electrical properties of the contact pad, the under bump metallurgy or the contact therebetween.

23. A method according to claim 22 wherein the liquified solder will wet the solder soluble metal in a period of between about one and about ten seconds and wherein the solder soluble metal will completely dissolve in the liquified solder in a period of between about thirty seconds to one minute.

24. A method according to claim 21 wherein the step of covering the layer of under bump metallurgy with a layer of solder soluble metal comprises photolithographic patterning of the solder soluble metal upon the under bump metallurgy.

25. A method of aligning solder on a substrate, the method comprising:

(a) forming a layer of solder-wettable under bump metallurgy on a contact pad and wherein the contact pad is upon a semiconductor material and is surrounded on the semiconductor material by a layer of dielectric surface passivation material upon the semiconductor material, and wherein the passivation material is non-wettable by solder;

(b) covering the layer of solder-wettable under bump metallurgy and a portion of the surrounding passivation layer with a layer of a solder soluble metal having a predetermined size area which is larger than the area of the layer of under bump metallurgy; and (c) coating the layer of solder soluble metal with liquified solder for a time sufficient to substantially wet the solder soluble metal with solder, but insufficient to substantially completely dissolve the solder soluble metal in the liquid solder, such that the volume and alignment of solder deposited upon the layer of solder soluble metal is defined by the predetermined size area of the layer of solder soluble metal and the wetting angle formed between the passivation material and the liquid solder.

26. A method of aligning a solder bump on a substrate, the method comprising:

(a) aligning a metal contact pad on the surface of a semiconductor material;

(b) surrounding the contact pad with a layer of dielectric surface passivation material which is non-wettable to solder so that the perimeter of the contact pad touches the dielectric surface passivation material;

(c) forming a layer of solder-wettable under bump metallurgy having a predetermined size area on the contact pad and wherein the under bump metallurgy substantially covers the contact pad;

(d) covering the layer of solder-wettable under bump metallurgy with a layer of solder soluble metal having a predetermined size area which is larger than the predetermined size area of the layer of under bump metallurgy and which extends onto the dielectric surface passivation material surrounding the contact pad;

(e) coating the layer of solder soluble metal with liquified solder for a time sufficient to substantially wet the solder soluble metal with solder, but insufficient to substantially completely dissolve the solder soluble metal in the liquid solder, such that the area and alignment of solder deposited upon the layer of solder soluble metal is defined by the predetermined size area of the layer of solder soluble metal rather than by the area of the under bump metallurgy;

(f) solidifying the solder;

(g) reheating the solder to liquid solder for a time sufficient for the solder soluble metal to substantially completely dissolve in the liquid solder so that the liquid solder retreats form the larger predetermined size area that was defined by the solder soluble metal to the smaller predetermined size area of the solder-wettable under bump metallurgy, and thereby forms an aligned solder bump upon the under bump metallurgy, with the size and alignment of the solder bump being defined by the predetermined size area of the solder-wettable under bump metallurgy; and (h) solidifying the defined solder bump.

* * * * *